United States Patent
Galinggana, Jr. et al.

(10) Patent No.: US 9,558,814 B2
(45) Date of Patent: Jan. 31, 2017

(54) HYBRID ANALOG AND DIGITAL MEMORY DEVICE

(71) Applicant: HGST Netherlands B.V., Amsterdam (NL)

(72) Inventors: Roger F. Galinggana, Jr., Cabuyao Laguna (PH); James Arnold V. Gregana, Cabuyao Laguna (PH); Lloyd Henry I. Li, Metro Manila (PH)

(73) Assignee: HGST Netherlands, B.V., Amsterdam (NL)

( * ) Notice: Subject to any disclaimer, the term of this patent is extended or adjusted under 35 U.S.C. 154(b) by 119 days.

(21) Appl. No.: 14/683,850

(22) Filed: Apr. 10, 2015

(65) Prior Publication Data
US 2016/0300608 A1    Oct. 13, 2016

(51) Int. Cl.
*G11C 16/04* (2006.01)
*G11C 11/56* (2006.01)

(52) U.S. Cl.
CPC ........ *G11C 11/5642* (2013.01); *G11C 11/5628* (2013.01)

(58) Field of Classification Search
CPC ....... G11C 11/5642; G11C 16/26; G11C 16/24
See application file for complete search history.

(56) References Cited

U.S. PATENT DOCUMENTS

| | | | |
|---|---|---|---|
| 5,973,956 A * | 10/1999 | Blyth | G11C 11/5621 365/185.03 |
| 6,044,004 A | 3/2000 | Kramer | |
| 6,363,012 B1 | 3/2002 | Lin et al. | |
| 6,903,361 B2 | 6/2005 | Gilton | |
| 7,049,872 B2 * | 5/2006 | Diorio | G06F 1/10 327/234 |
| 7,982,259 B2 | 7/2011 | Ichige et al. | |
| 2002/0003252 A1 | 1/2002 | Iyer | |
| 2002/0163031 A1 | 11/2002 | Liu et al. | |
| 2006/0067112 A1 * | 3/2006 | Ferrant | G11C 8/14 365/158 |
| 2008/0079061 A1 | 4/2008 | Ding et al. | |
| 2016/0049192 A1 * | 2/2016 | Lee | G11C 16/3427 365/185.03 |

OTHER PUBLICATIONS

Atwood et al., "Intel StrataFlash Memory Technology Overview," Intel Technology Journal, 1997, 8 pages.

* cited by examiner

*Primary Examiner* — Tuan T Nguyen
(74) *Attorney, Agent, or Firm* — Shumaker & Sieffert, P.A.

(57) ABSTRACT

A memory cell including a floating gate transistor including a floating gate, and an analog sensor element adjacent to the floating gate, where an electrical characteristic of the analog sensor element is affected by an amount of charge on the floating gate.

20 Claims, 6 Drawing Sheets

HYBRID ANALOG AND DIGITAL MEMORY DEVICE

TECHNICAL FIELD

This disclosure relates to non-volatile memory devices.

BACKGROUND

Memory devices may include internal, semiconductor, integrated circuits in computers or other electronics devices. There are many different types of memory including random-access memory (RAM), read only memory (ROM), dynamic random access memory (DRAM), static RAM (SRAM), and synchronous dynamic RAM (SDRAM). Memory may be non-volatile memory or volatile memory.

One type of non-volatile memory includes flash memory. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) may be stored in flash memory devices for personal use in personal computer systems.

Non-volatile memory devices, including flash memory devices, are also incorporated into solid-state storage devices, such as solid-state drives (SSDs).

SUMMARY

In one example, the disclosure describes a memory cell including a floating gate transistor comprising a floating gate; and an analog sensor element adjacent to the floating gate, wherein an electrical characteristic of the analog sensor element is affected by the amount of charge on the floating gate.

In another example, the disclosure describes a memory device including a plurality of memory cells. According to this example, at least one memory cell of the plurality of memory cells includes a floating gate transistor comprising a floating gate; and an analog sensor element adjacent to the floating gate, wherein an electrical characteristic of the analog sensor element is affected by the amount of charge on the floating gate. Additionally, in this example, the memory device also include write circuitry electrically connected to the at least one floating gate transistor, wherein the write circuitry comprises a digital-to-analog converter; and read circuitry electrically connected to the at least one analog sensor element, wherein the read circuitry comprises an analog-to-digital converter.

In another example, the disclosure describes a method including converting a plurality of bits to be written to a memory cell to a corresponding analog electrical signal. According to this example, the memory cell comprises a floating gate transistor comprising a floating gate and an analog sensor element adjacent to the floating gate. An electrical characteristic of the analog sensor element is affected by the amount of charge on the floating gate. In this example, the method also includes applying the analog electrical signal to a control gate of the floating gate transistor to cause an amount of charge to be on the floating gate, wherein the amount of charge is related to the analog electrical signal.

In another example, the disclosure describes measuring a signal indicative of an electrical characteristic of an analog sensor element included in a memory cell. According to this example, the memory cell comprises a floating gate transistor comprising a floating gate and an analog sensor element adjacent to the floating gate, wherein an electrical characteristic of the analog sensor element is affected by on the amount of charge on the floating gate. The method of this example also includes converting the signal indicative of the electrical characteristic to a bit.

The details of one or more examples are set forth in the accompanying drawings and the description below. Other features, objects, and advantages will be apparent from the description and drawings, and from the claims.

DETAILED DESCRIPTION

The disclosure describes memory devices that include memory cells including a floating gate transistor including a floating gate, and an analog sensor element adjacent to the floating gate. An electrical characteristic of the analog sensor element is affected by the amount of charge on the floating gate. This electrical characteristic may be read or sensed by read circuitry of the memory device. Because the sensor element is analog, the electrical characteristic may vary substantially continuously (e.g., continuously or nearly continuously) in relationship to the charge on the floating gate. By relating a value or range of values of the electrical characteristic to a predetermined value of a bit or set of bits, the value of the electrical characteristic may be used to represent data.

In some examples, the electrical characteristic may change by a greater magnitude than the change in charge on the floating gate. This may allow larger ranges of the electrical characteristic to represent a predetermined value of a bit or set of bits, which may facilitate reading of data from the memory cell, e.g., compared to directly detecting the charge on the floating gate. Additionally, because the range of values for the electrical characteristic may be relatively large, the range of values for the electrical characteristic may be divided into a plurality of sub-ranges, and each sub-range may represent a unique bit or set of bits. In some examples, the range may be divided into a sufficient number of sub-ranges so that the electrical characteristic may represent a set of 4 bits. In this way, in some implementations, a single memory cell may store 4 bits of information, which may increase storage density compared to flash memory cells. Additionally, because the multiple bits may be represented by a single electrical characteristic, in some cases, reading of data may be faster than reading data from a multi-level flash memory cell.

The analog sensor element may include, for example, a resistive sensor element, a capacitive sensor element, an inductive sensor element, or a piezoelectric sensor element. For example, a resistive sensor element may include a magnetoresistive sensor. The resistance of the magnetoresistive sensor may be affected by an applied magnetic field. The applied magnetic field may be affected by the charge on the floating gate. Thus, the charge on the floating gate affects the resistance of the magnetoresistive sensor.

Figure 1:
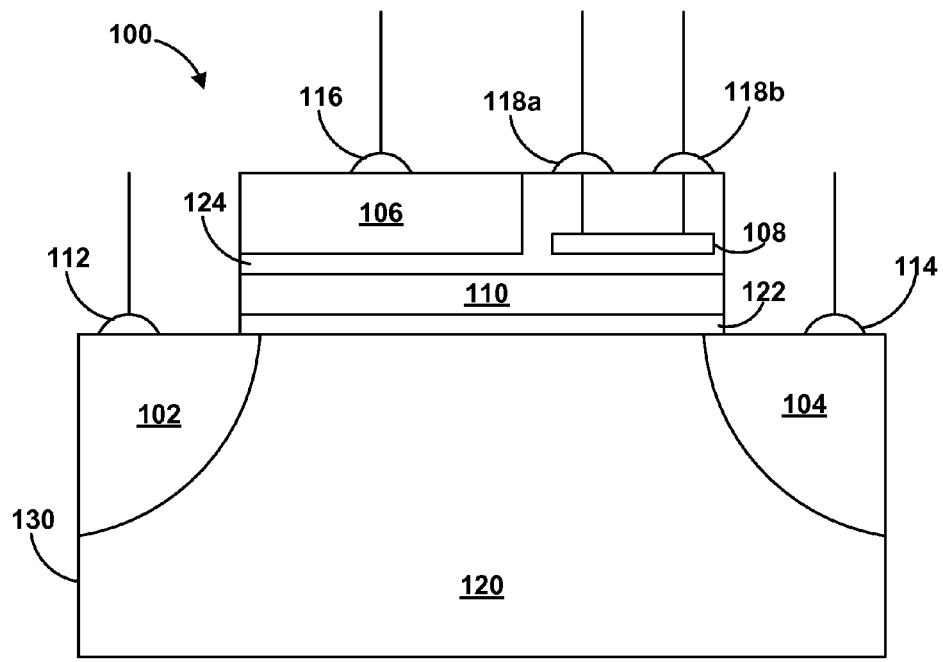
FIG. 1 is a conceptual and schematic block diagram illustrating an example memory cell including a floating gate transistor that includes a floating gate, and an analog sensor element adjacent to the floating gate.

FIG. 1 is a conceptual and schematic block diagram illustrating an example memory cell 100 including a floating gate transistor 130. Floating gate transistor 130 includes a body 120, a source 102 and a drain 104 separated by a channel of body 120, a control gate 106, and a floating gate 110. Memory cell 100 also includes an analog sensor element 108 adjacent to floating gate 110.

In some examples, body 120 includes an N-type semiconductor, while source 102 and drain 104 each include a P-type semiconductor. In other examples, body 120 includes a P-type semiconductor, while source 102 and drain 104 each include an N-type semiconductor.

Source 102 and drain 104 are electrically connected to a source lead 112 and a drain lead 114, respectively. Source lead 112 and drain lead 114 may connect to a voltage source, which may apply a voltage across source 102 and drain 104, e.g., during programming of memory cell 100.

Floating gate transistor 130 also includes a first dielectric layer 122 on body 120. First dielectric layer 122 supports floating gate 110 and electrically insulates floating gate 110 from body 120, source 102, and drain 104. First dielectric layer 122 may include any suitable dielectric material, including, for example, silica, silicon nitride, or the like. In some examples, first dielectric layer 122 is sufficiently thin to allow electron tunneling across first dielectric layer 122 between body 120 and floating gate 110, and may be referred to as a tunnel oxide.

Floating gate 110 is on first dielectric layer 122. Floating gate 110 is configured to store charge injected in floating gate 110 during a write process to memory cell 100. In some examples, floating gate 110 includes polysilicon. Floating gate 110 may be electrically insulated from one or both of source 102 and drain 104 by the first dielectric layer 122.

Floating gate transistor 130 further includes a second dielectric layer 124. Second dielectric layer 124 is on floating gate 110 and between floating gate 110 and control gate 106. In this way, second dielectric layer 124 may electrically insulate control gate 106 from floating gate 110. In some examples, second dielectric layer 124 partly, substantially, or completely surrounds floating gate 106. In some examples, control gate 106 includes polysilicon. In other examples, control gate 106 includes a metal other than polysilicon. By applying a sufficient voltage to control gate 106, e.g., via control gate lead 116, a channel of body 120 between source 102 and drain 104 may be made to be electrically conductive. The voltage required to cause the channel to be electrically conductive may depend on the amount of charge on floating gate 110.

In some examples, second dielectric layer 124 is contiguous with at least a portion of first dielectric layer 122, such that floating gate 110 is substantially completely (e.g., completely or nearly completely) surrounded by first dielectric layer 122 and second dielectric layer 124. In some examples, second dielectric layer 124 includes the same dielectric material as first dielectric layer 122. In other examples, second dielectric layer 124 includes a different dielectric material than first dielectric layer 124. As another example, one or both of first dielectric layer 122 and second dielectric layer 124 may include a gate oxide, an interpoly dielectric, a tunnel oxide, or an oxide-nitride-oxide film.

A charge on floating gate 110 can be modified by applying suitable voltages across predetermined regions of floating gate transistor 130 (e.g., between source 102 and drain 104) and to control gate 106 so that electrons transfer from body 120 tunnel to floating gate 110 e.g., using tunneling or hot-electron injection. The charge on floating gate 110 may remain substantially permanently (in the absence of intentional modification), even when memory cell 100 is not powered, because the floating gate 110 is electrically insulted from adjacent electrically conductive structures e.g., by first dielectric layer 122 and the second dielectric layer 124. The magnitude of the charge on floating gate 110 influences the required voltage to be applied at control gate 106 to allow passage of electrons between source 102 and drain 104.

A logical state of memory cell 100 may be associated with the amount of charge on floating gate 110. For example, a first amount of charge and a second amount of charge on floating gate 110 may correspond to the binary logical states off (0) and on (1), respectively. As another example, the amount of charge on floating gate 110 may vary within a range defined by predetermined threshold values, and various amounts of charge within the range may each correspond to one of a plurality of logical states. In some examples, the plurality of logical states consists of two states, for instance, off (0) and on (1). In other examples, the plurality of logical states consists of four states, for instance, corresponding to the permutations of a two digit binary number, such as 00, 01, 10 and 11. In still other examples, the plurality of logical states consists of $2^n$ states, corresponding to the permutations of an n-digit binary number.

In accordance with one or more examples of this disclosure, memory cell 100 further includes an analog sensor element 108 adjacent to floating gate 110. Analog sensor element 108 is the element of memory cell 100 through which the charge on floating gate 110 is measured. Analog sensor element 108 is sufficiently close to floating gate 110 that an electrical characteristic of analog sensor element 108 is affected by the amount of the charge on floating gate 110. For example, a magnitude of the electrical characteristic of analog sensor element 108 may be related by a first determinable mathematical relationship to the amount of charge on floating gate 110. In some examples, a change in the magnitude of the electrical characteristic of analog sensor 108 may be related by a second determinable mathematical relationship to a change in the amount of charge on floating gate 110. In some examples, changes in the electrical characteristic of analog sensor element 108, measuring the electrical characteristic of analog sensor element 108, or both, do not substantially alter the amount of charge on floating gate 110.

Analog sensor element 108 may include a sensor for which an electrical characteristic is affected by the charge on floating gate 110. The electrical characteristic may be determined, e.g., by causing a current to flow through analog sensor element 108 via sensor leads 118a and 118b. In some examples, the electrical characteristic may change to a greater degree or a degree that is more easily measured than the change in charge on floating gate 110.

Figure 5:
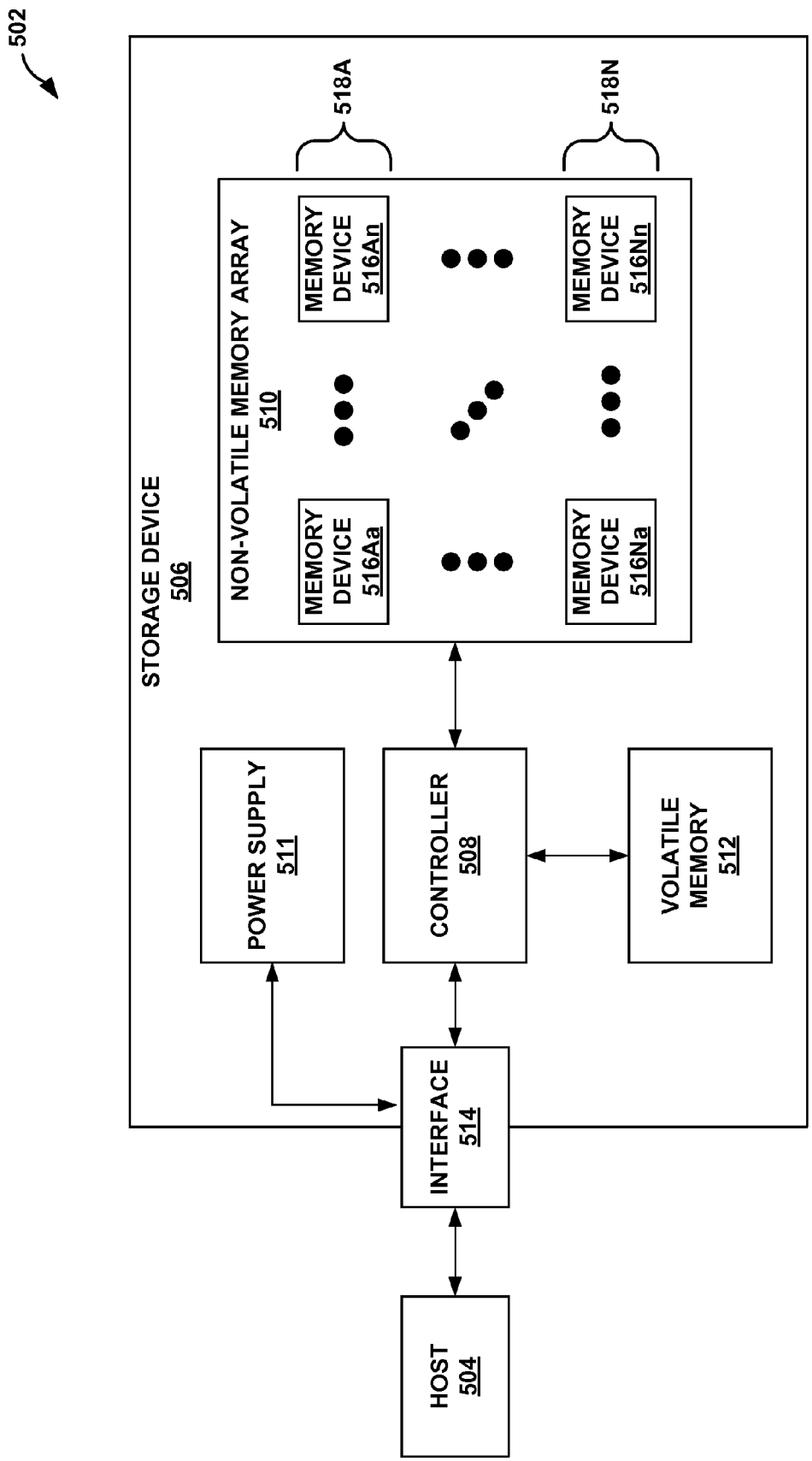
FIG. 5 is a conceptual and schematic block diagram illustrating an example storage environment in which a storage device may function as a storage device for a host device, in accordance with one or more techniques of this disclosure
Figure 7:
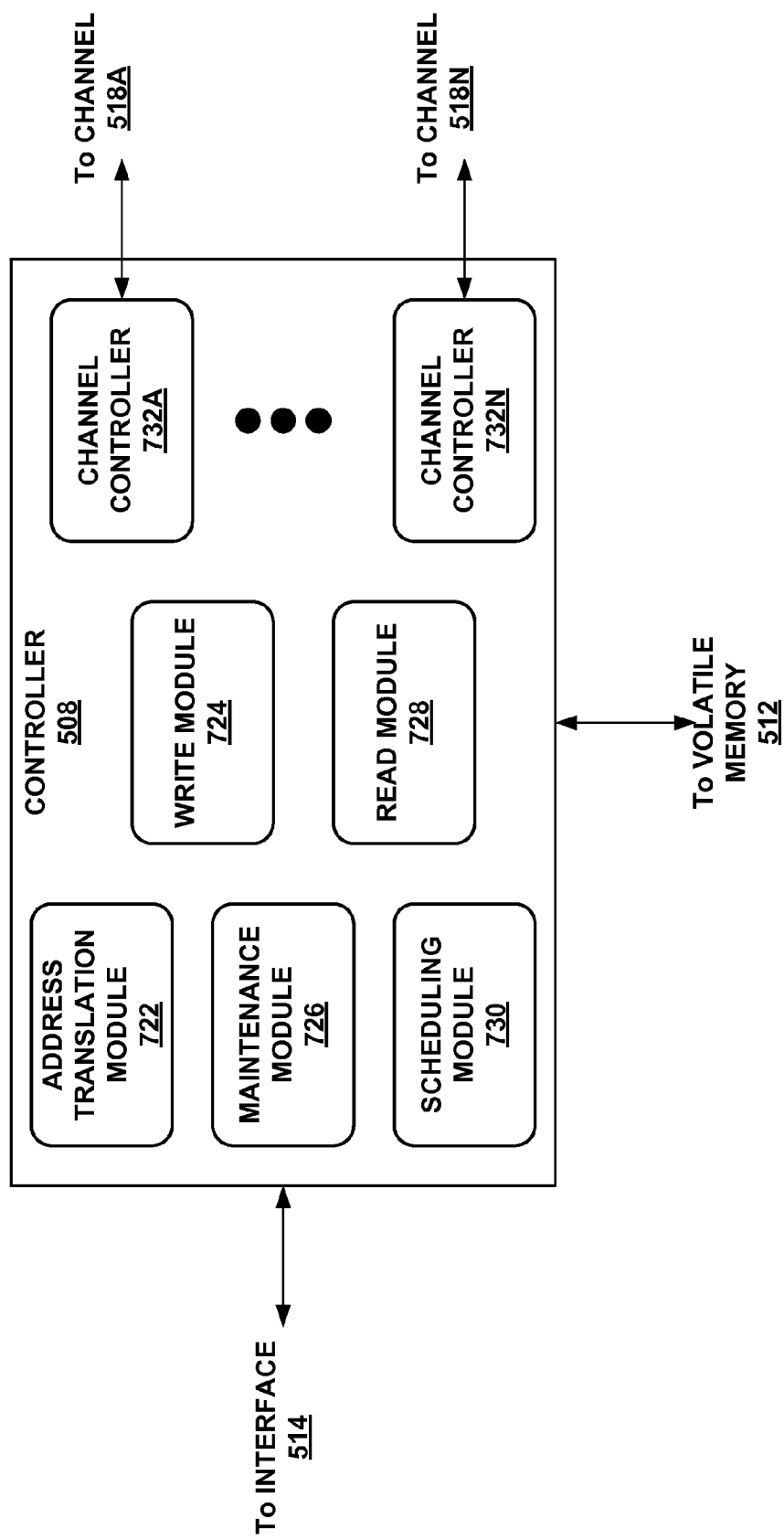
FIG. 7 is a conceptual and schematic block diagram illustrating an example controller, in accordance with one or more techniques of this disclosure.

Memory cell 100 may be electrically connected to a controller that includes read circuity (see, e.g., FIGS. 5 and 7). The read circuitry may be configured to measure the value of the electrical characteristic of analog sensor element 108 and relate the value of the electrical characteristic to a defined value for a bit (e.g., a 0 or a 1) or a defined set of values for a plurality of bits (e.g., four bits). Because, in some examples, the electrical characteristic may change to a greater degree or a degree that is more easily measured than the change in charge on floating gate 110, memory cell 100 may allow more bits to reliably be stored by a single memory cell 100. This may increase memory density of a memory device including memory cell 100, which may lead to a greater memory capacity per unit area of the memory device. In some examples, memory cell 100 including analog sensor element 108 may increase a read throughput, a write throughput, or both, of data to the memory device including memory cell 100 compared to a flash memory cell, as multiple bits can be written to or read from memory cell 100 in a single write or read operation.

In some examples, analog sensor element 108 may include a resistive sensor, such as a magnetoresistive sensor, and the resistance of analog sensor element 108 may is affected by the amount of charge on floating gate 110. An analog sensor element 108 that includes a magnetoresistive sensor may include a configuration that utilizes giant magnetoresistance, colossal magnetoresistance, tunnel magnetoresistance, or the like.

In a magnetoresistive sensor utilizing giant magnetoresistance, two thin films of ferromagnetic material may be separated by a thin film of non-magnetic material. The resistance of the magnetoresistive sensor utilizing giant magnetoresistance changes based on the relative orientation of magnetic moments (or spins) of the two thin films of ferromagnetic material. A magnetoresistive sensor utilizing giant magnetoresistance may have a current in plane or current perpendicular to the plane configuration.

In a magnetoresistive sensor utilizing tunnel magnetoresistance, two thin films of ferromagnetic material may be separated by a thin film (e.g., a few nanometers) of non-magnetic material in a magnetic tunnel junction. The resistance of the magnetoresistive sensor utilizing tunnel magnetoresistance changes based on the relative orientation of magnetic moments (or spins) of the two thin films of ferromagnetic material. A magnetoresistive sensor utilizing tunnel magnetoresistance may have a current in plane or current perpendicular to the plane configuration.

An analog sensor element 108 that includes a magnetoresistive sensor may include a lattice of nickel, cobalt, ruthenium, manganese, or chromium film material.

In an example in which analog sensor element 108 includes a magnetoresistive sensor, the charge on floating gate 110 creates a magnetic field, which changes the resistance of analog sensor element 108. The resistance can be measured by passing a current through analog sensor element 108 via sensor leads 118a and 118b. The output current may be provided to a voltage divider circuit, then an analog-to-digital converter. The analog-to-digital converter may be configured to convert a given current to a predetermined corresponding bit value or a corresponding value for a plurality of bits. In this way, the charge on floating gate 110 may be measured indirectly using analog sensor 108, and the charge on floating gate 110 may be related to a predetermined bit value or a predetermined value for a plurality of bits.

Therefore in various examples, memory cell 100 may be associated with logical states that may be read by determining the electrical characteristic of analog sensor 108. As described with reference to FIG. 1 above, in some examples, the analog sensor includes a resistive sensor, such as a magnetoresistive sensor. In other examples, the analog sensor includes a capacitive sensor, as described with reference to FIG. 2 below.

Figure 2:
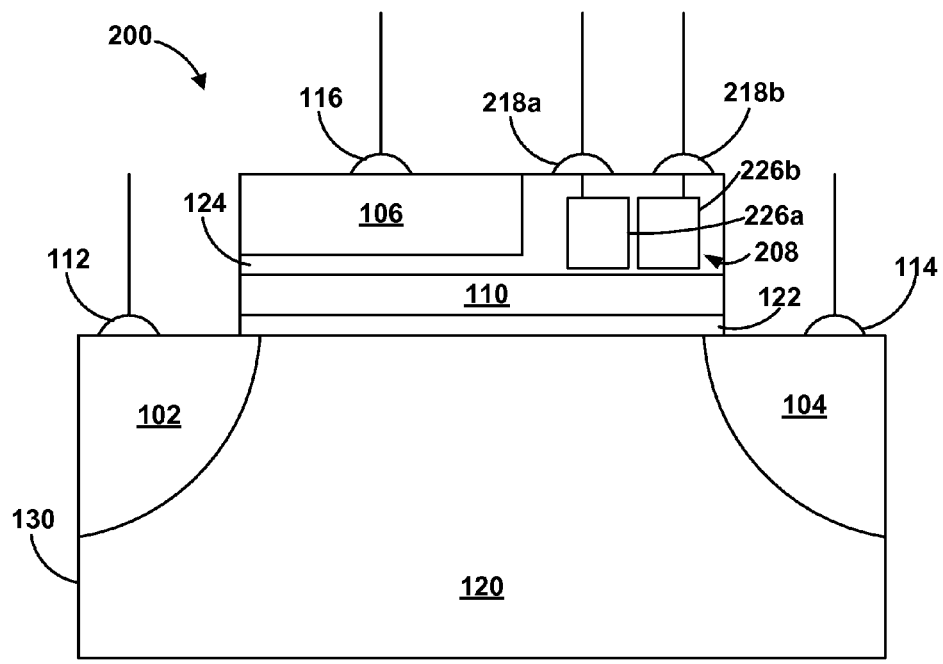
FIG. 2 is a conceptual and schematic block diagram illustrating another example memory cell including a floating gate transistor that includes a floating gate, and an analog sensor element including a capacitive sensor adjacent to the floating gate.

FIG. 2 is a conceptual and schematic block diagram illustrating an example memory cell 200 including a floating gate transistor 130 and an analog sensor 208. Floating gate transistor 130 is substantially similar to floating gate transistor 130 described above with reference to FIG. 1. Floating gate transistor 130 includes body 120, source 102 and drain 104, control gate 106, and floating gate 110.

Unlike memory cell 100 of FIG. 1, memory cell 200 of FIG. 2 includes an analog sensor element that includes a capacitive sensor 208. In some examples, capacitive sensor 208 includes capacitive elements 226a and 226b separated by a capacitive distance, as shown in FIG. 2. Capacitive elements 226a and 226b may include any material capable of conducting electrical current. For example, capacitive elements 226a and 226b include metals, alloys, semi-conductors, or compositions including any combination of these materials. In some examples, capacitive sensor 208 is a component of an integrated circuit that behaves substantially similar to a capacitor including capacitive elements. In various examples, capacitive elements 226a and 226b may be disposed horizontally, vertically, or in any other suitable geometric configuration with respect to floating gate 110.

In some examples, at least a portion of a surface of capacitive element 226a faces and is substantially parallel to at least a portion of a surface of capacitive element 226b. In some examples, the capacitive distance is measured between the substantially parallel portions of capacitive elements 226a and 226b. In some examples, the capacitive distance is occupied by a dielectric. The dielectric may include, for example, an oxide, a nitride, a ceramic, a semiconductor, a semiconductor depletion region, or the like. In some examples, the dielectric between capacitive elements 226a and 226b may be the same as or part of second dielectric layer 124.

Capacitive sensor 208 exhibits a capacitance. The capacitance of capacitive sensor 208 depends on factors including the composition of capacitive elements 226a and 226b, the capacitive distance, the dielectric constant of the dielectric, and the strengths of electromagnetic fields passing through capacitive sensor 208, capacitive elements 226a or 226b, or the capacitive distance. In accordance with examples of this disclosure, capacitive sensor 208 is adjacent to floating gate 110 and sufficiently close to floating gate 110 that the capacitance of the capacitive sensor is affected by the amount of charge on floating gate 110. For example, the charge on floating gate 110 creates an electric field, which affects the capacitance of capacitive sensor 208. The capacitance of capacitive sensor 208 can be measured, for example, by passing a high-frequency alternating current through capacitive sensor 208 via sensor leads 218a and 218b and measuring the resulting voltage across capacitive sensor 208. As the capacitance of capacitive sensor 208 is affected by the charge on floating gate 110, the capacitance of capacitive sensor 208 (and, thus, the voltage across capacitive sensor 208) may provide an indication of the charge on floating gate 110. The output current may be provided to a frequency-dependent voltage divider circuit, then an analog-to-digital converter. The analog-to-digital converter may be configured to convert a given current to a predetermined corresponding bit value or a corresponding value for a plurality of bits. In this way, the charge on floating gate 110 may be measured indirectly using capacitive sensor 208, and the charge on floating gate 110 may be related to a predetermined bit value or a predetermined value for a plurality of bits.

Figure 3:
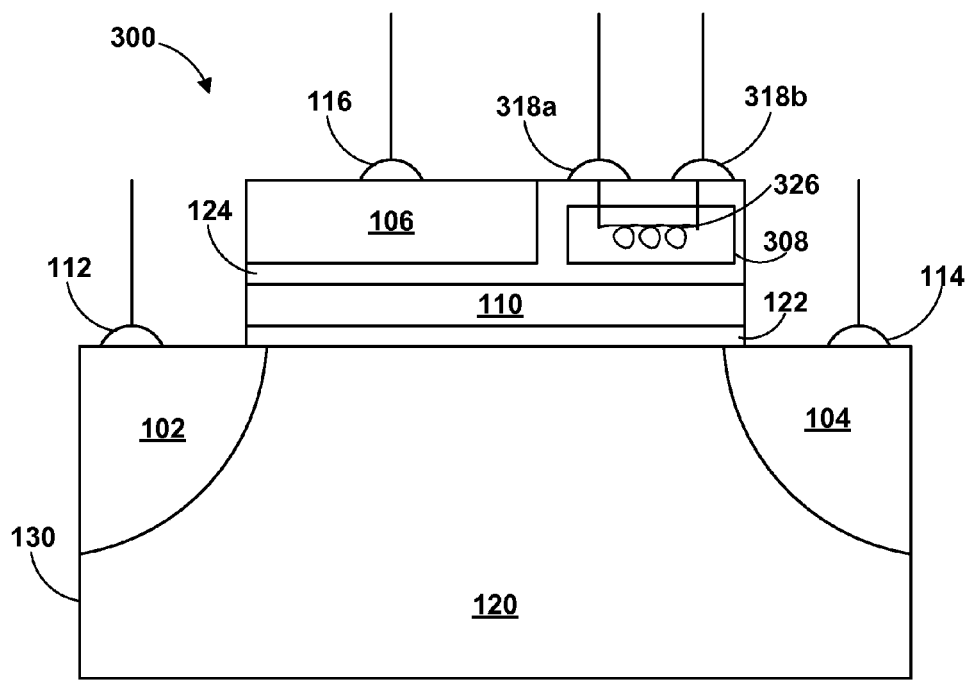
FIG. 3 is a conceptual and schematic block diagram illustrating another example memory cell including a floating gate transistor that includes a floating gate, and an analog sensor element including an inductive sensor adjacent to the floating gate.

As described with reference to FIG. 2 above, in some examples, the analog sensor includes capacitive sensor 208. In other examples, the analog sensor includes an inductive sensor, as described with reference to FIG. 3 below. FIG. 3 is a conceptual and schematic block diagram illustrating an example memory cell 300 including a floating gate transistor 130 and an analog sensor 308. Floating gate transistor 130 is substantially similar to floating gate transistor 130 described above with reference to FIG. 1. Floating gate transistor 130 includes body 120, source 102 and drain 104, control gate 106, and floating gate 110.

Unlike memory cell 100 of FIG. 1 and memory cell 200 of FIG. 2, memory cell 300 includes an analog sensor element that includes an inductive sensor 308. In some examples, inductive sensor 308 includes an inductive element 326. Inductive element 326 may include any material capable of conducting electrical current, in a shape that provides inductance, such as a coil, a spiral or the like. In some examples, inductive element 326 includes a metal, an alloy, a semiconductor, or a composition including any combination of these materials. In some examples, inductive sensor 308 includes a core disposed adjacent to inductive element 326, e.g., within the coil or between the spirals. In some examples, the core includes material exhibiting a high electromagnetic permeability, such as ferromagnetic material. In some examples, the core additionally or alternatively includes a material that does not exhibit a high electromagnetic permeability, such as a dielectric. In other examples, the inductor does not include a core. Inductive element 326 may be disposed horizontally, vertically, or in any other suitable geometric configuration with respect to floating gate 110.

Inductive sensor 308 exhibits an inductance, which depends on factors including the composition of inductive element 326, the composition of the core (if inductive sensor 308 includes a core), the spacing or other geometry of inductive element 326, and the strengths of any electromagnetic fields passing through inductive sensor 308, inductive element 326, or the core (if present). In some examples, the inductance of inductive sensor 308 is affected by the amount of charge on floating gate 110. For example, the charge on floating gate 110 creates an electric field, which may affect the inductance of inductive sensor 308.

The inductance of inductive sensor 308 may be measured by passing a current through inductive sensor 308 via sensor leads 318a and 318b. For example, an alternating current may be passed through inductive sensor 308. The output current may be provided to a frequency dependent voltage divider circuit, then an analog-to-digital converter. The analog-to-digital converter may be configured to convert a given current to a predetermined corresponding bit value or a corresponding value for a plurality of bits. In this way, the charge on floating gate 110 may be measured indirectly using inductive sensor 308, and the charge on floating gate 110 may be related to a predetermined bit value or a predetermined value for a plurality of bits.

As described with reference to FIG. 3 above, in some examples, the analog sensor includes inductive sensor 308. In other examples, the analog sensor includes a piezoelectric sensor, as described with reference to FIG. 4 below.

Figure 4:
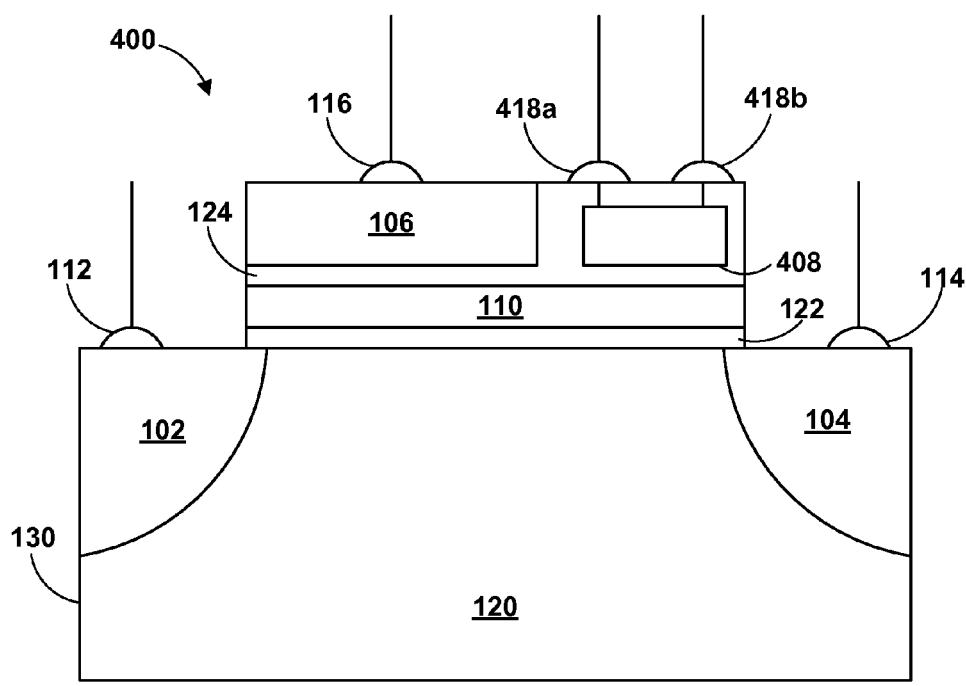
FIG. 4 is a conceptual and schematic block diagram illustrating another example memory cell including a floating gate transistor that includes a floating gate, and an analog sensor element including a piezoelectric sensor adjacent to the floating gate.

FIG. 4 is a conceptual and schematic block diagram illustrating an example memory cell 400 including a floating gate transistor 130 and an analog sensor 408. Floating gate transistor 130 is substantially similar to floating gate transistor 130 described above with reference to FIG. 1. Floating gate transistor 130 includes body 120, source 102 and drain 104, control gate 106, and floating gate 110.

Unlike memory cell 100 of FIG. 1, memory cell 200 of FIG. 2, and memory cell 300 of FIG. 3, memory cell 400 of FIG. 4 includes an analog sensor element that includes a piezoelectric sensor 408. The piezoelectric sensor includes a piezoelectric element (not shown). The piezoelectric element may include a material capable of exhibiting a piezoelectric effect, such as a piezoelectric ceramic a piezoelectric single crystal material, or the like. The piezoelectric element may be disposed horizontally, vertically, or in any other suitable geometric configuration with respect to floating gate 110.

The piezoelectric element exhibits a resonant frequency, which may depend on factors including, for example, the material from which the piezoelectric element is formed, the shape and geometry of the piezoelectric element, and the strength of any electromagnetic field passing through piezoelectric sensor 408 (e.g., the piezoelectric element). Because charge of floating gate 110 generates an electric field, the resonant frequency of the piezoelectric sensor may be affected by the amount of charge on floating gate 110. The resonant frequency of piezoelectric sensor 408 may change the overall frequency of a circuit including piezoelectric sensor 408.

In some examples, the frequency of the circuit that includes piezoelectric sensor 408 may be measured by passing a current, such as an alternating current, through piezoelectric sensor 408 via sensor leads 418a and 418b. The output current may be provided to a frequency-dependent voltage divider circuit, then an analog-to-digital converter. The analog-to-digital converter may be configured to convert a given current to a predetermined corresponding bit value or a corresponding value for a plurality of bits. In this way, the charge on floating gate 110 may be measured indirectly using piezoelectric sensor 408, and the charge on floating gate 110 may be related to a predetermined bit value or a predetermined value for a plurality of bits.

In various examples described above with reference to FIGS. 1-4, memory cells 100, 200, 300, and 400 may be associated with logical states that may be read by determining the electrical characteristic of an analog sensor. In some examples, storage devices in a storage environment include the memory cells described above, as described below with reference to FIGS. 5-7

FIG. 5 is a conceptual and schematic block diagram illustrating an example storage environment 502 in which storage device 506 may function as a storage device for host device 4, in accordance with one or more techniques of this disclosure. For instance, host device 504 may utilize non-volatile memory devices included in storage device 506 to store and retrieve data. In some examples, storage environment 502 may include a plurality of storage devices, such as storage device 506, that may operate as a storage array. For instance, storage environment 502 may include a plurality of storages devices 506 configured as a redundant array of inexpensive/independent disks (RAID) that collectively function as a mass storage device for host device 4.

Storage environment 502 may include host device 504 which may store and/or retrieve data to and/or from one or more storage devices, such as storage device 506. As illustrated in FIG. 5, host device 504 may communicate with storage device 506 via interface 514. Host device 504 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like. Host device 504 may identify data stored in storage environment 502 using logical or virtual addresses.

As illustrated in FIG. 5, storage device 506 may include controller 508, non-volatile memory array 510 (NVMA 510), power supply 511, volatile memory 512, and interface 514. In some examples, storage device 506 may include additional components not shown in FIG. 5 for sake of clarity. For example, storage device 506 may include a printed board (PB) to which components of storage device 506 are mechanically attached and which includes electrically conductive traces that electrically interconnect components of storage device 506; and the like. In some examples, the physical dimensions and connector configurations of storage device 506 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 506 may be directly coupled (e.g., directly soldered) to a motherboard of host device 504.

Storage device 506 may include interface 514 for interfacing with host device 504. Interface 514 may include one or both of a data bus for exchanging data with host device 504 and a control bus for exchanging commands with host device 4. Interface 514 may operate in accordance with any suitable protocol. For example, interface 514 may operate in accordance with one or more of the following protocols: advanced technology attachment (ATA) (e.g., serial-ATA (SATA) and parallel-ATA (PATA)), Fibre Channel, small computer system interface (SCSI), serially attached SCSI (SAS), peripheral component interconnect (PCI), and PCI-express. The electrical connection of interface 514 (e.g., the data bus, the control bus, or both) is electrically connected to controller 508, providing electrical connection between host device 504 and controller 508, allowing data to be exchanged between host device 504 and controller 508. In some examples, the electrical connection of interface 514 may also permit storage device 506 to receive power from host device 504. For example, as illustrated in FIG. 5, power supply 511 may receive power from host device 4 via interface 514.

Storage device 506 includes controller 508, which may manage one or more operations of storage device 506. For instance, controller 508 may manage the reading of data from and/or the writing of data to memory devices 516.

In some examples, it may not be practical for controller 508 to be separately connected to each memory device of memory devices 516. As such, the connections between memory devices 516 and controller 508 may be multiplexed. As an example, memory devices 516 may be grouped into channels 518A-518N (collectively, "channels 618"). For instance, as illustrated in FIG. 5, memory devices 516Aa-516An may be grouped into first channel 518A, and memory devices 516Na-516Nn may be grouped into $N^{th}$ channel 518N. The memory devices 516 grouped into each of channels 518 may share one or more connections to controller 508. For instance, the memory devices 516 grouped into first channel 518A may be attached to a common I/O bus and a common control bus. Storage device 506 may include a common I/O bus and a common control bus for each respective channel of channels 518. In some examples, each channel of channels 518 may include a set of chip enable (CE) lines which may be used to multiplex memory devices on each channel. For example, each CE line may be connected to a respective memory device of memory devices 516. In this way, the number of separate connections between controller 508 and memory devices 516 may be reduced. Additionally, as each channel has an independent set of connections to controller 508, the reduction in connections may not significantly affect the data throughput rate as controller 508 may simultaneously issue different commands to each channel.

Storage device 506 may include power supply 511, which may provide power to one or more components of storage device 506. When operating in a standard mode, power supply 511 may provide power to the one or more components using power provided by an external device, such as host device 504. For instance, power supply 511 may provide power to the one or more components using power received from host device 504 via interface 514. In some examples, power supply 511 may include one or more power storage components configured to provide power to the one or more components when operating in a shutdown mode, such as where power ceases to be received from the external device. In this way, power supply 511 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

Storage device 506 may include volatile memory 512, which may be used by controller 508 to store information. In some examples, controller 508 may use volatile memory 512 as a cache. For instance, controller 508 may store cached information 13 in volatile memory 512 until cached information 13 is written to memory devices 516. As illustrated in FIG. 4, volatile memory 512 may consume power received from power supply 511. Examples of volatile memory 512 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 506 may include NVMA 510, which may include a plurality of memory devices 516Aa-516Nn (collectively, "memory devices 516"). Each of memory devices 516 may be configured to store and/or retrieve data. For instance, a memory device of the memory devices 516 may receive data and a message from controller 508 that instructs the memory device to store the data. Similarly, the memory device of memory devices 516 may receive a message from controller 508 that instructs the memory device to retrieve data. In some examples, each of memory devices 516 may be referred to as a die. In some examples, a single physical chip may include a plurality of dies (i.e., a plurality of memory devices 516). In some examples, each of memory devices 516 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

One or more of memory devices 516 may include any one or more of the memory cells disclosed according to this disclosure, for instance, the memory cells 100, 200, 300, or 400 described with reference to FIGS. 1-4, or any other suitable memory cells. Various examples of memory devices 516 are described with reference to FIG. 6 below.

Figure 6:
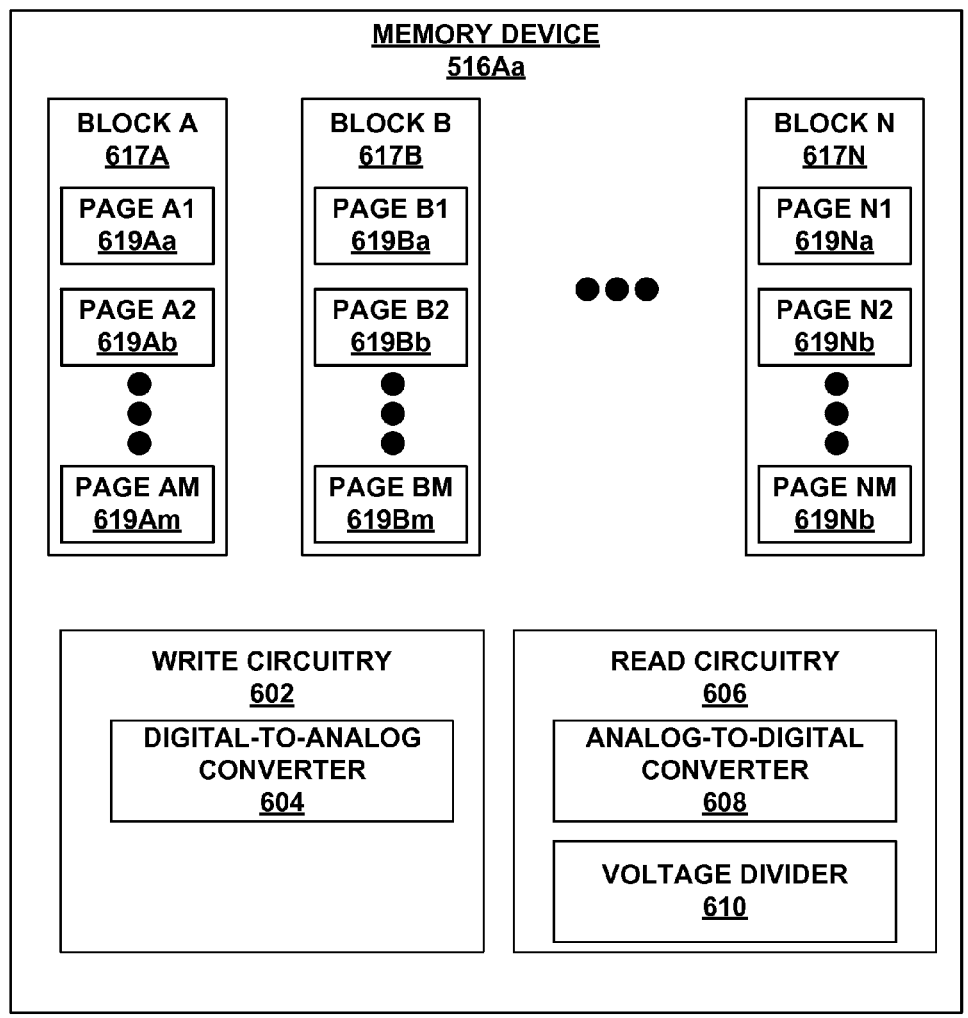
FIG. 6 is a conceptual block diagram illustrating an example memory device that includes a plurality of blocks, each block including a plurality of pages, in accordance with one or more techniques of this disclosure.

FIG. 6 is a conceptual block diagram illustrating an example memory device 516Aa. Memory device 516Aa includes a plurality of blocks 617A-617N (collectively, "blocks 617"), each of which is divided into a plurality of pages 619Aa-619Nm (collectively, "pages 619"). Each page of pages 619 within memory device 516Aa may include a plurality of memory cells, for instance memory cells according to various examples described above with reference to FIGS. 1-4, such as memory cell 100, memory cell 200, memory cell 300 or memory cell 400.

The plurality of memory cells in memory device 516Aa may include memory cells organized according to NAND, NOR or other suitable architectures, including modified NAND or NOR, and may store data based on a charge contained in a floating gate of a transistor for each flash memory cell. In NAND and NOR flash memory devices, the flash memory device may be divided into a plurality of blocks, each of which may be divided into a plurality of pages. In some examples of NAND flash memory devices, rows of memory cells may be electrically connected using a word line to define a page of the plurality of pages 619. In various examples, respective cells in each of the pages 619 may be electrically connected, in series, to respective bit lines. In examples of NOR flash memory devices, memory cells may be connected, in parallel, to a bit line. In other examples, memory cells may be organized according to individually addressable architectures, where each memory cell may be individually selected for erasure, writing or reading. In some examples, the respective floating gate transistor portions of the plurality of memory cells may be electrically connected according to a NAND-type architecture, while the respective analog sensor element of the plurality of memory cells may be electrically connected such that the respective analog sensor elements are individually addressable.

In some examples, memory device 516Aa also includes a write circuitry 602 for writing or programming the plurality of memory cells and a read circuitry 606 for reading from the plurality of memory cells. Write circuitry 602 may include a digital-to-analog converter 604, and is electrically connected to the respective memory cells in memory device 516Aa.

Read circuitry 606 may include an analog-to-digital converter 608 and a voltage divider 610, and is electrically connected to respective analog sensor elements of respective memory cells of memory device 516Aa. In an example, analog-to-digital converter 608 is configured to convert a signal indicative of the electrical characteristic of the analog sensor element to a bit or a plurality of bits.

FIG. 7 is a conceptual and schematic block diagram illustrating an example controller 508. In some examples, controller 508 may include an address translation module 722, a write module 724, a maintenance module 726, a read module 728, a scheduling module 730, and a plurality of channel controllers 732A-732N (collectively, "channel controllers 732"). In other examples, controller 508 may include additional modules or hardware units, or may include fewer modules or hardware units. Controller 508 may include a microprocessor, digital signal processor (DSP), application specific integrated circuit (ASIC), field programmable gate array (FPGA), or other digital logic circuitry. In some examples, controller 508 may be a system on a chip (SoC).

Controller 508 may interface with the host device 504 via interface 514 and manage the storage of data to and the retrieval of data from memory devices 516. For example, write module 724 of controller 508 may manage writes to memory devices 516. In some examples, write module 724 may receive a message from host device 504 via interface 514 instructing storage device 506 to store data associated with a logical data address and the data. Write module 724 may manage writing of the data to memory devices 516.

For example, write module 724 may communicate with address translation module 722, which manages translation between logical data addresses used by host device 504 to manage storage locations of data and physical data addresses used by write module 724 to direct writing of data to memory devices 516. Address translation module 722 of controller 508 may utilize a logical to physical data address translation table that associates logical data addresses (or logical block addresses) of data stored by memory devices 516 to physical data addresses (or physical block addresses) of data stored by memory devices 516. For example, host device 504 may utilize the logical data addresses of the data stored by memory devices 516 in instructions or messages to storage device 506, while write module 724 utilizes physical data addresses of the data to control writing of data to memory devices 516. In some examples, read module 728 may utilize physical data addresses to control reading of data from memory devices 516. The physical data addresses correspond to actual, physical locations of memory devices 516. In some examples, address translation module 722 may store the logical to physical data address translation table in volatile memory 512.

In this way, host device 504 may be allowed to use a static logical data address for a certain set of data, while the physical data address at which the data is actually stored may change. Address translation module 722 may maintain the logical to physical data address translation table to map the logical data addresses to physical data addresses to allow use of the static logical data address by the host device 504 while the physical data address of the data may change, e.g., due to wear leveling, garbage collection, or the like. In some examples, the logical to physical data address translation table may be a single layer table, such that by applying a hash to a logical data address received from host device 504, address translation module 722 may directly retrieve a corresponding physical data address.

Each channel controller of channel controllers 732 may be connected to a respective channel of channels 518. In some examples, controller 508 may include the same number of channel controllers 732 as the number of channels 518 of storage device 502. Channel controllers 732 may perform the intimate control of addressing, programming, erasing, and reading of memory devices 516 connected to respective channels, e.g., under control of write module 724, read module 728, and/or maintenance module 726, for instance, via communicating with write circuitry 50 and read circuitry 60.

Write module 724 of controller 508 may perform one or more operations to manage the writing of data to memory devices 516. For example, write module 724 may manage the writing of data to memory devices 516 by communicating with write circuitry 602 as described with reference to FIG. 6, selecting one or more blocks within memory devices 516 to store the data and causing memory devices of memory devices 516 that include the selected blocks to actually store the data. As discussed above, write module 724 may cause address translation module 722 to update the logical to physical data address translation table based on the selected blocks. For instance, write module 724 may receive a message from host device 504 that includes a unit of data and a logical data address, select a block and page within a particular memory device of memory devices 516 to store the data, cause the particular memory device of memory devices 516 to actually store the data (e.g., via a channel controller of channel controllers 732 that corresponds to the particular memory device), and cause address translation module 722 to update the logical to physical data address translation table to indicate that the logical data address corresponds to the selected physical data address within the particular memory device of memory devices 516.

In some examples, in addition to causing the data to be stored by memory devices 516, write module 724 may cause memory devices 516 to store information which may be used to recover the unit of data should one or more of the blocks fail or become corrupted. The parity information may be used to recover the data stored by other blocks. In some examples, the parity information may be an XOR of the data stored by the other blocks.

In some examples, write module 724 may communicate an instruction to write circuitry 602 of a particular memory device (e.g., memory device 516Aa) via a respective channel controller of channel controllers 732 that includes the selected physical block address and the data. Write circuitry 602 may convert the data from a digital signal to an analog signal using digital-to-analog converter 604. For example, digital-to-analog converter 604 may be configured to convert a bit or a plurality of bits to be written to a memory cell to a corresponding analog electrical signal applied to the control gate of the floating gate transistor. The corresponding analog signal applied to the control gate results in an amount of charge on the floating gate. In some examples, the digital-to-analog converter 604 may be configured to convert a bit in a first logical state (for instance, on) to an first analog signal that results in a first amount of charge on the floating gate and a bit in a second logical state (for instance, off) to a second analog signal that results in a second amount of charge on the floating gate.

In some example, digital-to-analog converter 604 is configured to convert a plurality of bits to be written to a memory cell to a corresponding analog electrical signal applied to the control gate of the floating gate transistor. Depending on the number of bits in the plurality of bits, in various examples, digital-to-analog converter 604 may be configured to be an n-bit digital-to-analog converter, such that it accepts n bits of input and generates a corresponding analog signal based on the n bits. Digital-to-analog converter 604 may implement a predetermined linear or non-linear, additive, multiplicative, or other mathematical function to convert the n-bit input to a single analog signal. In some examples, the corresponding analog electrical signal is unique to the plurality of bits, and results in a unique charge on the floating gate. Hence, in some examples, each unique plurality of bits corresponds to a unique charge on the floating gate of the floating gate transistor in the memory cell. In this way, a single memory cell in one of memory devices 516 may be used to store a plurality of bits. In general, the number of bits may be at least one bit, e.g., one bit, two bits, three bits, four bits, or more.

In some examples, instead of write circuitry 602 and digital-to-analog converter 604 being implemented in each memory device of memory devices 516, the functionality of write circuitry 602 and digital-to-analog converter 604 may be implemented as part of write module 724 of controller 508.

Read module 728 similarly may control reading of data from memory devices 516. For example, read module 728 may receive a message from host device 504 requesting data with an associated logical data address. Address translation module 722 may convert the logical data address to a physical data address using the flash translation layer or table. Read module 728 then may control one or more of channel controllers 732 to retrieve the data from the physical data addresses. Similar to write module 724, read module 728 may communicate with read circuitry 606 to select one or more blocks and communicate a message to that causes read circuitry 606 to read the data from the selected blocks.

As described above, the signal indicative of the electrical characteristic of the analog sensor element is affected by the amount of charge on the floating gate in the memory cell. Read circuitry 606 may generate a signal that is transmitted through the analog sensor element to measure the electrical characteristic of the analog sensor element. The electrical signal may depend on the electrical characteristic to be measured. For example, the electrical signal may be a DC or an AC electrical signal.

The signal received from the analog sensing element has a signal characteristic that indicates the electrical characteristic representative of the charge on the floating gate. In some examples, this signal characteristic may be a current amplitude (e.g., if the electrical characteristic is resistance), a signal frequency (e.g., if the electrical characteristic is resonant frequency), or the like. In some examples, the received signal may be received by the voltage divider, which may be a frequency dependent voltage divider in some examples (such as when the analog sensing element is a capacitive sensor 208, an inductive sensor 308, or a piezoelectric sensor 408). After passing through the voltage divider, the received signal may be provided to the analog-to-digital converter 606. In some examples, the analog-to-digital converter 606 converts a signal having a characteristic (e.g., current amplitude) in a first range to a first logical state of a bit (for instance, high) and a signal having a characteristic (e.g., current amplitude) in a second, different range to a second logical state of the bit (for instance, low), so that the received signal is converted to a bit.

In an example, the analog sensor is configured such that each respective amount of charge from a plurality of different amounts of charge stored by the floating gate corresponds to a respective electrical characteristic value of a plurality of electrical characteristic values, and the analog-to-digital converter 608 is configured to convert a signal indicative of the each respective electrical characteristic value to a corresponding plurality of bits. In this way, multiple bits (e.g., 2, 3, 4, or more bits) may be stored by a single memory cell.

In some examples, analog-to-digital converter 608 may implement a predetermined linear or non-linear, additive, multiplicative, or other mathematical function to convert the magnitude of the signal to an n-bit output, where each of the n-bits represents one bit of the plurality of bits. In some examples, each corresponding plurality of bits is unique. For instance, the analog-to-digital converter 608 may implement an injective, or one-to-one, mathematical function to convert a unique characteristic or a unique range of characteristics of the signal to a unique plurality of bits.

In some examples, instead of read circuitry 606, analog-to-digital converter 608, and voltage divider 610 being implemented in each memory device of memory devices 516, the functionality of read circuitry 606, analog-to-digital converter 608, and voltage divider 610 may be implemented as part of write module 724 of controller 508.

Maintenance module 726 may be configured to perform operations related to maintaining performance and extending the useful life of storage device 506 (e.g., memory devices 516). For example, maintenance module 726 may implement at least one of wear leveling or garbage collection.

Scheduling module 730 of controller 508 may schedule operations to be performed by memory devices 516. For instance, scheduling module 730 may cause one or more of memory devices 516 to perform one or more operations based on requests received from other components of controller 508. In some examples, scheduling module 730 may cause a particular memory device of memory devices 516 to perform one or more operations by causing a channel controller corresponding to the particular memory device to output commands to the particular memory device. As one example, scheduling module 730 may permit channel controller 732A to output commands that cause memory device 516Aa to store data.

Various examples of the controller 508 are described with reference to FIGS. 5-7 above, including examples of controller 508 communicating with various modules to write to and read from memory cells. Various example techniques for programming memory cells and measuring signals from memory cells are described with reference to FIGS. 8 and 9 below.

Figure 8:
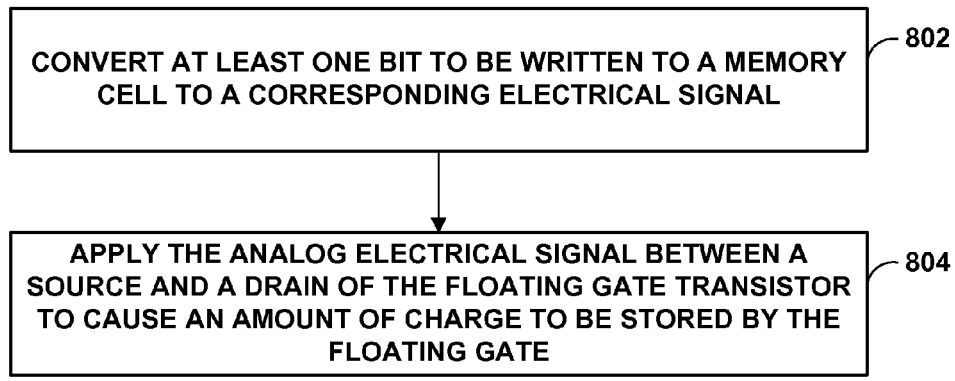
FIG. 8 is a flow diagram illustrating an example technique for programming a memory cell including a floating gate transistor that includes a floating gate, and an analog sensor element adjacent to the floating gate.

FIG. 8 is a flow diagram illustrating an example technique for programming a memory cell including a floating gate transistor including a floating gate and an analog sensor element adjacent to the floating gate. In some examples, memory cells 100, 200, 300 and 400 described in various examples with reference to FIGS. 1-4 above may be programmed by the example technique of FIG. 8. The technique of FIG. 8 will be described with reference to memory cell 100 of FIG. 1, memory device 516Aa of FIG. 6, and controller 508 of FIGS. 5 and 7 for purposes of description only. It will be appreciated that the technique of FIG. 8 may be used to program other memory cells (e.g., memory cells 200, 300, or 400 of FIGS. 2-4), that memory cell 100 may be programmed using a different technique, or both.

The technique of FIG. 8 includes converting, by digital-to-analog converter 604, at least one bit to be written to memory cell 100 to a corresponding analog electrical signal (802). As described above, in some examples, the at least one bit includes a single bit. In other examples, the at least one bit includes two or more bits, such as two bits, three bits, or four bits.

The technique of FIG. 8 also includes applying, by write circuitry 602, the analog electrical signal to control gate 106 of floating gate transistor 130 to cause an amount of charge to be on floating gate 110 (804). The amount of charge may be related to the magnitude of the analog electrical signal. In some examples, write circuitry 602 may be electrically connected to source 102, drain 104, and control gate 106 in a NAND-type arrangement or a NOR-type arrangement. In an example, the analog electrical signal is a voltage applied to control gate 106, predetermined to result in either hot-electron injection or Fowler-Nordheim tunneling, whereby a charge is deposited on floating gate 110 depending on the magnitude, sign, and duration of the analog electrical signal. In this way, the characteristics of the analog electrical signal may influence the amount of charge of floating gate 110.

In some examples, the at least one bit comprises a first at least one bit, the corresponding analog electrical signal is a first analog electrical signal, and the memory cell is a first memory cell. The technique of FIG. 8 may be performed for each memory cell to which data is to be written. In other words, for each memory cell to which data is to be written, digital-to-analog converter 604 may convert at least one bit to be written to the memory cell to a corresponding analog electrical signal (802), and write circuitry 602 may apply the analog electrical signal to the control gate of the memory cell to cause an amount of charge to be on the floating gate of the memory cell (804). If the at least one bit is different, the analog signal may be different, such that the technique may include converting a second, different plurality of bits to be written to a second memory cell to a second corresponding analog electrical signal. When the first and second plurality of bits is different, the first and second analog electrical signals may be unique to the different plurality of bits.

Figure 9:
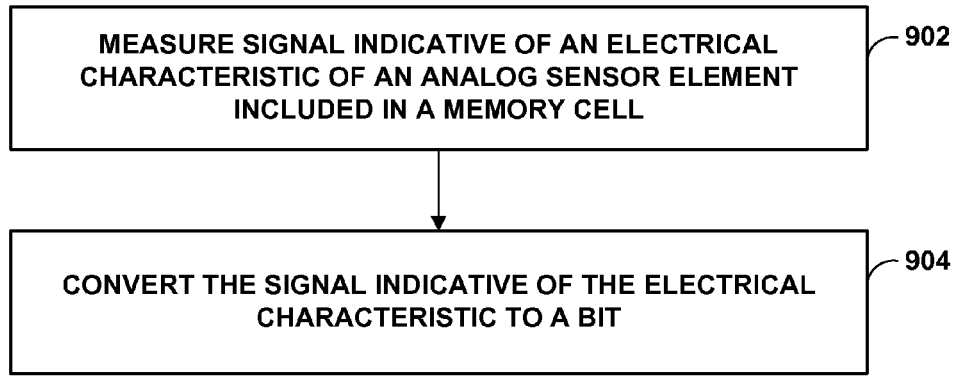
FIG. 9 is a flow diagram illustrating an example technique for reading a memory cell including a floating gate transistor that includes a floating gate, and an analog sensor element adjacent to the floating gate.

FIG. 9 is a flow diagram illustrating an example technique for reading a memory cell including a floating gate transistor comprising a floating gate and an analog sensor element adjacent to the floating gate. The technique of FIG. 9 will be described with reference to memory cell 100 of FIG. 1, memory device 516Aa of FIG. 6, and controller 508 of FIGS. 5 and 7 for purposes of description only. It will be appreciated that the technique of FIG. 9 may be used to program other memory cells (e.g., memory cells 200, 300, or 400 of FIGS. 2-4), that memory cell 100 may be programmed using a different technique, or both.

The technique of FIG. 9 may include measuring, by read circuitry 606, a signal indicative of an electrical characteristic of analog sensor element 108 (902) As described above, depending on the electrical characteristic to be measured, the signal may include an alternating current or a direct current signal. In some examples, the signal may be provided to a voltage divider 610, which, in some examples, may be a frequency dependent voltage divider. The output from voltage divider 610 may be provided to analog-to-digital converter 608.

In an example, the referenced technique includes converting, by analog-to-digital converter 608, the signal indicative of the electrical characteristic to a bit (904). In some examples, analog-to-digital converter 608 may be configured to convert the signal indicative of the electrical characteristic to a plurality of bits. In some examples, the analog sensor is configured such that each respective amount of charge from a plurality of different amounts of charge on the floating gate corresponds to a respective electrical characteristic value of a plurality of electrical characteristic values. In some examples, converting the signal indicative of the electrical characteristic to the bit (904) includes converting a respective signal indicative of the respective electrical characteristic value to a corresponding plurality of bits.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A memory cell comprising:
a floating gate transistor comprising a floating gate; and
an analog sensor element adjacent to the floating gate, wherein an electrical characteristic of the analog sensor element is affected by an amount of charge on the floating gate.

2. The memory cell of claim 1, wherein the analog sensor element comprises a magnetoresistive sensor, and wherein the resistance of the magnetoresistive sensor is affected by the amount of charge on the floating gate.

3. The memory cell of claim 2, wherein the magnetoresistive sensor comprises a magnetic tunnel junction.

4. The memory cell of claim 1, wherein the analog sensor element comprises an inductive sensor, and wherein the inductance of the inductive sensor is affected by the amount of charge on the floating gate.

5. The memory cell of claim 1, wherein the analog sensor element comprises a capacitive sensor, and wherein the capacitance of the capacitive sensor is affected by the amount of charge on the floating gate.

6. The memory cell of claim 1, wherein the analog sensor element comprises a piezoelectric sensor, and wherein the resonant frequency of the piezoelectric sensor is affected by the amount of charge on the floating gate.

7. A memory device comprising:
a plurality of memory cells, wherein at least one memory cell of the plurality of memory cells comprises:
a floating gate transistor comprising a floating gate; and
an analog sensor element adjacent to the floating gate, wherein an electrical characteristic of the analog sensor element is affected by the amount of charge on the floating gate;
write circuitry electrically connected to the at least one floating gate transistor, wherein the write circuitry comprises a digital-to-analog converter; and
read circuitry electrically connected to the at least one analog sensor element, wherein the read circuitry comprises an analog-to-digital converter.

8. The memory device of claim 7, wherein the analog sensor element comprises at least one of:
a resistive sensor, wherein the resistance of the resistive sensor is affected by the amount of charge stored by the floating gate;
an inductive sensor, wherein the inductance of the inductive sensor is affected by the amount of charge stored by the floating gate;
a capacitive sensor, wherein the capacitance of the capacitive sensor is affected by the amount of charge stored by the floating gate; or
a piezoelectric sensor, wherein the resonant frequency of the piezoelectric sensor is affected by the amount of charge on the floating gate.

9. The memory device of claim 7, wherein the analog-to-digital converter is configured to convert a signal indicative of the electrical characteristic of the analog sensor element to a bit.

10. The memory device of claim 7, wherein the analog sensor is configured such that each respective amount of charge from a plurality of different amounts of charge stored by the floating gate corresponds to a respective electrical characteristic value of a plurality of electrical characteristic values, and wherein the analog-to-digital converter is configured to convert a signal indicative of the each respective electrical characteristic value to a corresponding plurality of bits.

11. The memory device of claim 10, wherein each corresponding plurality of bits is unique.

12. The memory device of claim 10, wherein the digital-to-analog converter is configured to convert a bit to be written to the at least one memory cell to a corresponding analog electrical signal applied between a source and a drain of the floating gate transistor.

13. The memory device of claim 10, wherein the digital-to-analog converter is configured to convert a plurality of bits to be written to the at least one memory cell to a corresponding analog electrical signal applied between a source and a drain of the floating gate transistor.

14. The memory device of claim 13, wherein the corresponding analog electrical signal is unique to the plurality of bits.

15. A method comprising:
    converting a plurality of bits to be written to a memory cell to a corresponding analog electrical signal, wherein the memory cell comprises a floating gate transistor comprising a floating gate and an analog sensor element adjacent to the floating gate, wherein an electrical characteristic of the analog sensor element is affected by the amount of charge on the floating gate; and
    applying the analog electrical signal to a control gate of the floating gate transistor to cause an amount of charge to be on the floating gate, wherein the amount of charge is related to the analog electrical signal.

16. The method of claim 15, wherein the plurality of bits comprises a first plurality of bits and the corresponding analog electrical signal is a first analog electrical signal, and the memory cell is a first memory cell, the method further comprising:
    converting a second, different plurality of bits to be written to a second memory cell to a second corresponding analog electrical signal, wherein the second memory cell comprises a floating gate transistor comprising a floating gate and an analog sensor element adjacent to the floating gate, wherein an electrical characteristic of the analog sensor element is affected by the amount of charge on the floating gate, and wherein the second analog electrical signal is unique to the second, different plurality of bits and the first analog electrical signal is unique to the first plurality of bits; and
    applying the second analog electrical signal to a control gate of the floating gate transistor of the second memory cell to cause an amount of charge to be on the floating gate, wherein the amount of charge is related to the second analog electrical signal.

17. The method of claim 15, further comprising:
    measuring a signal indicative of the electrical characteristic of the analog sensor element; and
    converting the signal indicative of the electrical characteristic to a bit.

18. A method comprising:
    measuring a signal indicative of an electrical characteristic of an analog sensor element included in a memory cell, wherein the memory cell comprises a floating gate transistor comprising a floating gate and an analog sensor element adjacent to the floating gate, wherein an electrical characteristic of the analog sensor element is affected by the amount of charge on the floating gate; and
    converting the signal indicative of the electrical characteristic to a bit.

19. The method device of claim 18, wherein:
    the analog sensor is configured such that each respective amount of charge from a plurality of different amounts of charge on the floating gate corresponds to a respective electrical characteristic value of a plurality of electrical characteristic values, and
    converting the signal indicative of the electrical characteristic to the bit comprises converting a respective signal indicative of the a respective electrical characteristic value to a corresponding plurality of bits.

20. The method of claim 19, wherein each corresponding plurality of bits is unique.

* * * * *